United States Patent [19]
Olzak et al.

[11] Patent Number: 5,810,919
[45] Date of Patent: Sep. 22, 1998

[54] HIGH TEMPERATURE PROTECTIVE WAX BLEND

[75] Inventors: Richard A. Olzak, Kirkland; Gary Kersten, Duvall, both of Wash.

[73] Assignee: Alliedsignal Inc., Morristown, N.J.

[21] Appl. No.: 961,336

[22] Filed: Oct. 30, 1997

[51] Int. Cl.⁶ .............. C08L 91/06; B65D 85/38

[52] U.S. Cl. ............ 106/270; 62/104.17; 62/134.1; 62/136; 252/62; 346/25; 174/522; 206/305; 206/521

[58] Field of Search ............ 106/270; 62/104.17, 62/134.1, 136; 252/62; 346/25; 174/52.2; 206/305, 521

[56] References Cited

U.S. PATENT DOCUMENTS

| | | | |
|---|---|---|---|
| 4,694,119 | 9/1987 | Groenewegen | 174/52.2 |
| 4,944,401 | 7/1990 | Groenewegen | 206/521 |

*Primary Examiner*—David Brunsman

[57] ABSTRACT

The present invention provides compositions and method for heat absorption which include between about 35 percent and about 45 percent by weight of an between about 35 percent and about 45 percent by weight of an N,N'-ethylenebis-stearamide wax having a melting point of between 232° C. and 240° C. and between about 65 percent and about 55 percent by weight of an N,N'-ethylenebisstearamide wax having a melting point of about 140° C., and thermally protected enclosures including the same.

8 Claims, 2 Drawing Sheets

HIGH TEMPERATURE PROTECTIVE WAX BLEND

BACKGROUND OF THE INVENTION

The present invention relates to compositions and methods for absorbing heat and to crash survivable protective enclosures such as flight data recorders used is aircraft and other vehicles operating over land and water. More particularly, the present invention relates to compositions useful as heat absorption in crash survivable enclosures which are capable of withstanding high impact, shock and mechanical penetration forces that commonly occur in a crash and the high temperatures, flames, and heat that often develop after a crash. The enclosures are designed to resist damage to solid state memory devises contained therein, even if the enclosure is subjected to immersion in fresh water or salt water for a prolonged period.

SUMMARY OF THE INVENTION

As a first aspect, the present invention provides a composition having improved heat dissipating properties. The composition comprises a) between about 35 percent and about 45 percent by weight of an N,N'-ethylenebisstearamide wax having a melting point of between 232° C. and 240° C.; and b) between about 65 percent and about 55 percent by weight of an N,N'-ethylenebisstearamide wax having a melting point of about 140° C. The improved heat dissipating properties are produced by the blend of waxes having different melting points.

In a second embodiment, the present invention provides a method for dissipating heat away from a heat sensitive device exposed to a high temperature environment. The method comprises surrounding the heat sensitive device with a composition comprising: a) between about 35 percent and about 45 percent by weight of an N,N'-ethylenebisstearamide wax having a melting point of between 232° C. and 240° C.; and b) between about 65 percent and about 55 percent by weight of an N,N'-ethylenebisstearamide wax having a melting point of about 140° C. The composition undergoes a phase transition in the high temperature environment, from a solid phase when the composition is not exposed to the high temperature environment to a liquid phase when the composition is exposed to the high temperature environment. The composition absorbs heat from the high temperature environment during the phase transition, and thereby dissipates heat away from the heat sensitive device.

As a third aspect, the present invention provides an enclosure for thermally protecting heat sensitive devices from a high temperature environment. The enclosure includes an outer housing having interior surfaces defining an interior cavity for containing the heat sensitive devices, and a composition comprising a) between about 35 percent and about 45 percent by weight of an N,N'-ethylenebisstearamide wax having a melting point of between 232° C. and 240° C.; and b) between about 65 percent and about 55 percent by weight of an N,N'-ethylenebisstearamide wax having a melting point of about 140° C. The composition occupies at least a portion of the interior cavity and substantially surrounds the heat sensitive devices. The composition exhibits a phase transition when subjected to the high temperature environment. The phase transition being from a solid phase when the composition is not exposed to the high temperature environment to a liquid phase when the composition is exposed to the high temperature environment. The composition absorbs heat from the high temperature environment during the phase transition.

These and other aspects of the present invention are described further in the detailed description and examples of the invention which follow.

BRIEF DESCRIPTION OF THE DRAWINGS

FIG. 1 demonstrates that the composition of the present invention is as effective at heat dissipation as conventional heat dissipating materials.

DESCRIPTION OF THE PREFERRED EMBODIMENT

Figure 1:
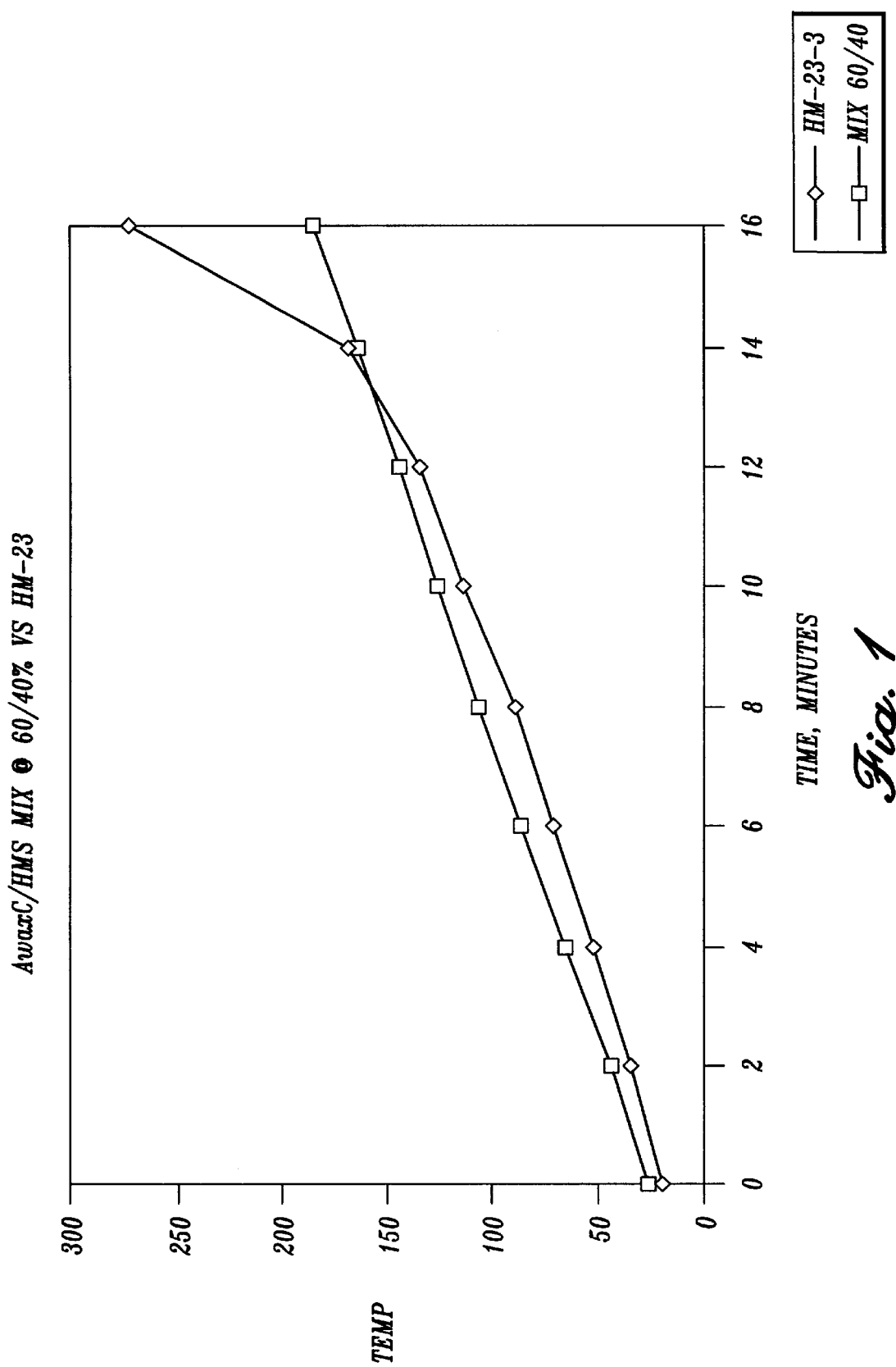
FIG. 1 is a graphical representation of the temperature versus time characteristics of one embodiment of the invention and the time versus temperature characteristics of conventional solid insulator material.

As used herein, all terms have their ordinary meaning in the art unless otherwise indicated. All percentages are percent by weight unless otherwise indicated.

The composition of the present invention includes a blend of wax-based substances which exhibit a phase transition in a high temperature environment. The composition of the present invention was designed to provide heat absorption characteristics which could not be attained with any single component. The heat absorption characteristics of the composition are useful for providing thermal insulation to heat sensitive devices in a fire or other high temperature environment. In accordance with the present invention, the composition exhibits a phase transition during which heat is absorbed from the environment. The temperature at which the phase transition occurs is selected to be: (a) above the peak temperature encountered under normal operating conditions; and (b) at or below the peak temperature objective for the heat sensitive devices to be protected by the composition.

In a fire or other high temperature environment, the composition of the present invention acts as a heat shield initially, by exhibiting a relatively high thermal inertia. When the composition reaches the phase transition point, it acts as a heat sink by utilizing the heat energy to convert the composition from the solid phase to the liquid phase. The use of the heat energy to produce this phase transition maintains the maximum temperature environment at an acceptable level.

The wax-based substances employed in the compositions of the present invention are amide-type synthetic organic waxes, many of which are commercially available in the industry for a variety of uses unrelated to heat absorption. The composition includes between about 35 percent and about 45 percent by weight of a first aside wax, an N,N'-ethylenebisstearamide (also known as N,N'-distearoyl-ethylenediamine) wax, having a melting point of between 232° C. and 240° C. One example of this wax is commercially available from Lonza, Industries of Fair Lawn, N.J. under the trade ACRAWAX HMS®. The composition also includes between about 65 percent and about 55 percent by weight of a second amide wax, N,N'-ethylenebisstearamide having the empirical formula $H_{33}C_{17}COHNC_2H_4NHCOC_{17}H_{35}$, and a melting point of about 140° C. On example of this wax is commercially available from Lonza, Industries of Fair Lawn, N.J. under the tradename ACRAWAX C®. In one preferred embodiment, the composition includes 40 percent by weight of the first wax component having a melting point of between 232° C. and 240° C. and about 60 percent by weight of the second wax component having a melting point of 140° C.

The first wax component of the composition, having the higher melting point, is commercially available in granulated form, and the second wax component is available in prilled or beaded form. This difference in form facilitates the creation of a uniform blend of the components to produce the composition of the present invention. The composition may be prepared by mechanically mixing, stirring or otherwise combining the components so as to provide a blend of uniform consistency. For example, the composition may be prepared by blending the prilled or beaded material into the granulated material. The difference in form of the components enables the visual observation of the blending process and inspection of the resulting blended composition to ensure uniformity.

The compositions of the present invention provide a number of advantages. The composition remains homogeneous indefinitely because the components of the composition have a natural affinity for each other. The components of the composition are safe, relatively easy to handle, relatively reasonable in cost, formable, and shock absorbing.

The compositions of the present invention are useful in methods of absorbing heat from a high temperature environment and dissipating heat away from a heat sensitive device. The present invention provides a method for dissipating heat from a heat sensitive device exposed to a high temperature environment, which includes surrounding the heat sensitive device with the composition of the present invention prior to exposing the heat sensitive device to the high temperature environment. When the heat sensitive device, surrounded by the composition of the present invention is subjected to the high temperature environment, the composition undergoes a phase transition from the solid phase to the liquid phase. During this phase transition, heat is absorbed from the high temperature environment. The use of the heat energy to produce the phase transition of the composition has the effect of maintaining the maximum temperature environment within the enclosure, in which the heat sensitive devices are contained, at an acceptable level which does not cause significant heat damage to the heat sensitive devices within the enclosure even though the temperature of the high temperature environment may be significantly greater than the temperature at which damage to the heat sensitive devices would otherwise occur.

The phase transition exhibited by the composition is essential to its utility as a heat absorbing, and thus heat dissipating substance. The composition undergoes a phase transition from a solid phase to a liquid phase. In other words, when the composition is not exposed to a high temperature environment, the composition is in a solid phase. When the composition is exposed to a high temperature environment, the composition melts into a liquid phase. During this phase transition from the solid to the liquid phase, the composition absorbs ambient heat energy from the high temperature environment.

The components of the composition were selected based upon the melting points of each component to provide a composition which exhibits the phase transition at the optimum point of exposure to the high temperature environment. The phase transition must not occur too quickly or too late during exposure to the high temperature environment.

The first wax component has a melting point of between 232° C. and 240° C. and a flash point of 280° C. The second wax component has a melting point of 140° C. and a flash point of 271° C. The fact that one compound has a melting point above the other, and that the two are uniformly mixed provides the composition with controllable phase transition characteristics. The phase transition characteristics of the composition may be altered by altering the amounts of the individual components in the composition. If a lower phase transition point (i.e., lower point at which exposure to the high temperature environment produces the phase transition) is desired, the composition may be formulated with a higher proportion of the lower melting point component. Similarly, if a higher phase transition point (i.e., higher point at which exposure to the high temperature environment produces the phase transition so that the composition endures the high temperature environment for a longer period of time before phase transition occurs) the composition may be formulated with a higher proportion of the higher melting point component.

FIG. 1 shows the phase transition characteristics of the composition of the present invention as compared to conventional heat absorption compositions which are currently employed in thermally protected enclosures such as flight data recorders. The data show that the composition of the present invention is as effective at heat dissipation as conventional heat dissipating materials comprising ACRAWAX HM-23®.

The compositions of the present invention are particularly useful in enclosures for thermally protecting one or more heat sensitive devices from a high temperature environment, such as aircraft flight data recorders which include heat sensitive devices for recording and storing data. Thermally protected flight data recorders are known in the art and are configured to provide a record of various important aircraft performance parameters over a predetermined time interval. Flight data recorders record performance parameters continuously from the time the electrical system of the aircraft is activated. Because they have a limited memory they can only hold information relating to such parameters for the predetermined time interval. Hence, as new data is continuously collected, it is continuously written over old data. In the event that the flight data recorder is deactivated, which occurs if the aircraft crashes, the flight data recorder will retain in memory the performance parameters recorded over the predetermined time interval immediately prior to deactivation. In operation, the information stored within a memory unit is ongoingly supplied by additional components of the flight data recorder system such as a data acquisition unit that receives input signals from various aircraft sensors and systems, and processes those signals to produce signals compatible with the recording or storage medium employed by the flight data recorder memory unit.

Figure 2:
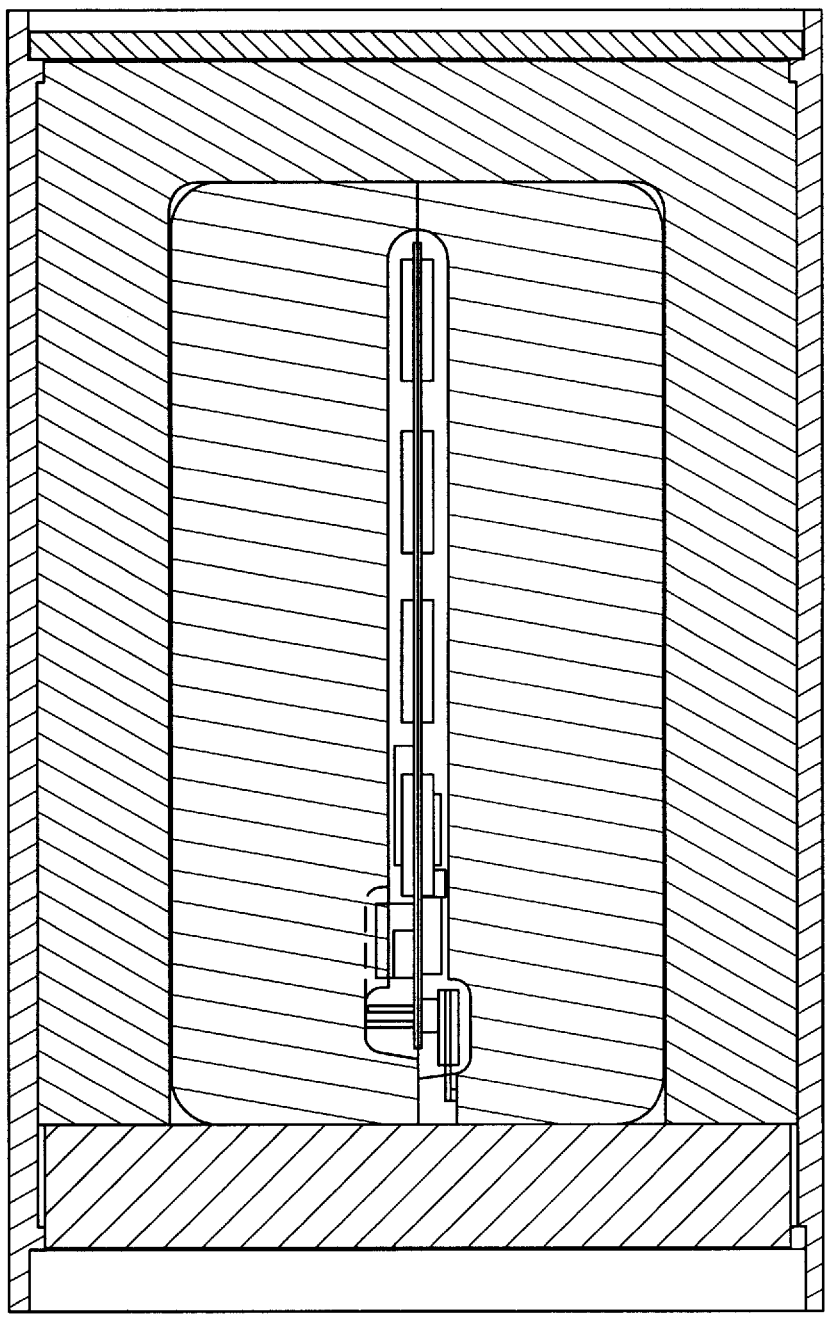
FIG. 2 is a cross-section of a thermally protected representation of an enclosure according to the present invention.

The compositions of the present invention may be employed in any conventional thermally protected flight data recorder, including but not limited to the flight data recorders described in U.S. Pat. Nos. 4,694,119 and 4,944,401 both the Gruenwegan, U.S. Pat. No. 4,600,449 to White et al., and U.S. Pat. No. 5,438,162 to Thompson et al., the disclosures of which are hereby incorporated by reference in their entirety. Generally, the thermally protected flight data recorders are one type of thermally protected generally represented in FIG. 2, enclosures which include an outer housing 15, the heat sensitive devices for recording data 25, and the thermal protecting composition 20 of the present invention.

The outer housing 15 of the enclosure 40 is typically constructed of a metal that exhibits a high thermal conductivity and high resistance to crushing and piercing. An intumescent coating or paint is generally applied to the exterior surfaces of the outer housing for additional thermal major axes. An insulating layer of solid material that exhibits a relatively low thermal conductivity adjoins each interior surface of the outer housing 15 to form a rectangular interior cavity that is centrally located within the outer housing 15.

The one or more heat sensitive devices 25 employed in the enclosure 10 are located within and contained by the interior cavity of insulation. The enclosure 40 may be provided in any suitable shape, and is typically substantially rectangular in cross-section when viewed perpendicular to each of its the housing. In a preferred embodiment of the invention, the heat sensitive devices 25 are solid state electronic memory devices for storing data which is to be recovered from each of the solid state electronic memory devices following exposure of the enclosure to a high temperature environment. Examples of such devices include semiconductor electronically erasable programmable read-only memory circuits. A data acquisition unit periodically supplies digital signals which are sequentially written into the semiconductor memory circuits so that the memory circuits store a sequence of digital words that is a time sampled data representation of the history for each parameter being monitored. Typically, with respect to currently employed techniques, data compression is generally employed to allow storing digital signals representative of a 15–30 minute time history for each monitored parameter.

To provide the heat shielding necessary to protect these heat sensitive devices from a high temperature environment to which the enclosure is subjected, the composition 20 of the present invention is provided in the open spaces of the interior cavity of the housing, substantially surrounding the heat sensitive devices. The composition 20 occupies at least a portion of the interior cavity. The compositions of the present invention are conformable to low pressure forming at temperatures below the melting point of either component. The ability to conform the composition of the present invention in its solid phase is yet another advantage of the present invention because the composition can be molded to both conform to the shape of the interior cavity and to surround the heat sensitive devices therein.

The compositions of the present invention are particularly well suited to use in enclosures such as flight recorders because the composition recedes in the presence of the heat of melting during the phase transition so as to avoid placing increasing pressure on the heat sensitive devices within and the interior surfaces of the interior cavity. The compositions of the present invention do not combust within the enclosure, and also exhibit a low enough vapor pressure to avoid rupturing the housing unit or causing pressure damage to the heat sensitive devices contained in the interior cavity. The compositions of the present invention also absorb radiant heat from any residual insulation and from the interior surfaces of the enclosure as the composition melts and flows against the heated interior surfaces. This heat is subsequently carried outside the container and disposed of in the flame front rather than building up inside the small cavity containing the heat sensitive devices.

In addition to their utility as heat absorbing materials, the compositions of the present invention are also useful in enclosures such as flight data recorders as shock absorbing materials. For example, the enclosure may be subjected to intense shock in the area of 3400 Gs on impact during crash conditions. Under such physical impact force, the compositions of the present invention absorb a portion of the shock by deforming only enough to divert the impact shock wave away from the memory device, but not enough to penetrate any surrounding insulation creating voids that might become heat flux paths to the heat sensitive devices. The density of the composition is naturally appropriate for this application.

The propensity of the compositions to peel off any smooth surface to which it might adhere during the phase transition and cooling makes it ideally suited to the application to smooth circuit boards and other memory components. Advantageously, the composition does not amalgamate with the silicone protective coatings employed on some memory systems.

Although the essential elements of the enclosures include only the housing 15, the heat sensitive devices 25, and the composition 20 of the present invention, one skilled in the art can envision a number of modifications to the enclosure which are based upon conventional technology in the art of flight data recorders, and are therefore contemplated by the instant invention. For example, it may be desirable to include as another element of the enclosure, a thermal insulating layer between the compositions of the present invention and the interior surfaces of the interior cavity. Suitable thermal insulating liners will be readily determinable by those skilled in the art and include a shell-like thermal liner positioned within the interior cavity adjacent to the interior surfaces of the interior cavity, which conforms to the geometric shape of the interior cavity. Preferably, the thermal liner is a unitary structure formed of a solid material that is a good thermal insulator (i.e., has a low thermal conductivity, K) and relatively low density. Examples of such materials include but are not limited to thermal insulators sold under the tradenames MIN-K 2000®, from Johns-Manville Co., of Denver Colo., and MICROTHERM®, from Upton-Wirral Merseyside, England.

The foregoing is illustrative of the present invention and is not to be construed as limiting thereof. The invention is defined by the following claims, with equivalents of the claims to be included therein.

That which is claimed is:

1. A composition having improved heat dissipating properties, said composition comprising:
    a) between about 35 percent and about 45 percent by weight of an N,N'-ethylenebisstearamide wax having a melting point of between 232° C. and 240° C.; and
    b) between about 65 percent and about 55 percent by weight of an N,N'-ethylenebisstearamide wax having a melting point of about 140° C.;

wherein said improved heat dissipating properties are produced by the blend of waxes having different melting points.

2. The composition according to claim 1, comprising about 40 percent by weight of the N,N'-ethylenebisstearamide wax having a melting point of between 232° C. and 240° C. and about 60 percent by weight of the N,N'-ethylenebisstearamide wax having a melting point of about 140° C.

3. A method for dissipating heat away from a heat sensitive device exposed to a high temperature environment, said method comprising surrounding said heat sensitive device with a composition comprising:
    a) between about 35 percent and about 45 percent by weight of an N,N'-ethylenebisstearamide wax having a melting point of between 232° C. and 240° C.; and
    b) between about 65 percent and about 55 percent by weight of an N,N'-ethylenebisstearamide wax having a melting point of about 140° C.;

wherein said composition undergoes a phase transition in said high temperature environment, from a solid phase when said composition is not exposed to said high temperature environment to a liquid phase when said composition is exposed to said high temperature environment, wherein said composition absorbs heat from said high temperature environment during said phase transition, and thereby dissipates heat away from said heat sensitive device.

4. The method according to claim 3, where said composition comprises about 40 percent by weight of the N,N'-ethylenebisstearamide wax having a melting point of between 232° C. and 240° C. and about 60 percent by weight of the N,N'-ethylenebisstearamide wax having a melting point of about 140° C.

5. An enclosure for thermally protecting one or more heat sensitive devices from a high temperature environment, said enclosure comprising:

an outer housing having interior surfaces defining an interior cavity, said interior cavity for containing said one or more heat sensitive devices; and a composition comprising:
 a) between about 35 percent and about 45 percent by weight of an N,N'-ethylenebisstearamide wax having a melting point of between 232° C. and 240° C.; and
 b) between about 65 percent and about 55 percent by weight of an N,N'-ethylenebisstearamide wax having a melting point of about 140° C.;

wherein said composition occupies at least a portion of said interior cavity and substantially surrounds said one or more heat sensitive devices; said composition exhibiting a phase transition when subjected to said high temperature environment, said phase transition being from a solid phase when said composition is not exposed to said high temperature environment to a liquid phase when said composition is exposed to said high temperature environment; wherein said composition absorbs heat from said high temperature environment during said phase transition.

6. The enclosure according to claim 5, wherein said one or more heat sensitive devices is a solid state electronic memory device for storing data which is to be recovered from each of said solid state electronic memory devices following exposure of said enclosure to said high temperature environment.

7. The enclosure according to claim 5, wherein said composition comprises about 40 percent by weight of the N,N'-ethylenebisstearamide wax having a melting point of between 232° C. and 240° C. and about 60 percent by weight of the N,N'-ethylenebisstearamide wax having a melting point of about 140° C.

8. The enclosure according to claim 5, further comprising a thermal insulating liner between said composition and said interior surfaces of said interior cavity.

* * * * *